United States Patent
Teich et al.

(10) Patent No.: US 7,031,856 B2
(45) Date of Patent: Apr. 18, 2006

(54) AUTOMATIC WIRE DIELECTRIC ANALYZER

(75) Inventors: Stanley Teich, Melville, NY (US); Marguerite A. Frank, Northport, NY (US)

(73) Assignee: Northrop Grumman Corporation, Los Angeles, CA (US)

( * ) Notice: Subject to any disclaimer, the term of this patent is extended or adjusted under 35 U.S.C. 154(b) by 72 days.

(21) Appl. No.: 10/358,545

(22) Filed: Feb. 5, 2003

(65) Prior Publication Data

US 2004/0153264 A1    Aug. 5, 2004

(51) Int. Cl.
*G01R 25/00* (2006.01)
*G01R 27/00* (2006.01)

(52) U.S. Cl. ....................................... 702/65
(58) Field of Classification Search ............. 702/65, 702/125, 57, 189; 324/533, 534, 535, 637, 324/642, 643, 644; 379/22.03, 22.01, 22
See application file for complete search history.

(56) References Cited

U.S. PATENT DOCUMENTS

| | | | | |
|---|---|---|---|---|
| 4,914,394 A * | 4/1990 | Meyer | ......................... | 324/534 |
| 5,581,019 A * | 12/1996 | Minor et al. | .................. | 73/115 |
| 5,646,537 A * | 7/1997 | Skaling et al. | ............. | 324/643 |
| 5,750,931 A * | 5/1998 | McGregor et al. | .... | 174/110 PM |
| 5,898,308 A * | 4/1999 | Champion | .................. | 324/643 |
| 5,916,671 A * | 6/1999 | Dauber et al. | ........... | 428/317.3 |
| 6,144,721 A | 11/2000 | Stephens | | |
| 6,442,498 B1 | 8/2002 | Krigel | | |
| 6,559,657 B1 * | 5/2003 | McCarthy et al. | .......... | 324/642 |
| 6,690,320 B1 * | 2/2004 | Benway et al. | ............. | 342/124 |
| 6,719,488 B1 * | 4/2004 | Kuroda et al. | ................. | 405/36 |
| 6,954,076 B1 * | 10/2005 | Teich | ......................... | 324/540 |
| 2001/0050629 A1 * | 12/2001 | Benway et al. | ............. | 342/124 |
| 2002/0032534 A1 | 3/2002 | Regier | | |
| 2002/0067171 A1 | 6/2002 | Lanan | | |
| 2002/0075009 A1 | 6/2002 | Butler | | |
| 2002/0106822 A1 | 8/2002 | Kim | | |
| 2002/0126273 A1 * | 9/2002 | Carsella et al. | ............. | 356/73.1 |
| 2002/0143500 A1 * | 10/2002 | Diede | ......................... | 702/189 |
| 2003/0118832 A1 * | 6/2003 | Skaling et al. | .............. | 428/412 |
| 2004/0130334 A1 * | 7/2004 | Sparkman | ................... | 324/644 |

* cited by examiner

*Primary Examiner*—John Barlow
*Assistant Examiner*—Demetrius Pretlow
(74) *Attorney, Agent, or Firm*—Stetina, Brunda Garred & Brucker (57) ABSTRACT

A system and method for automatically determining a dielectric constant for a cable of known length for use in a Time Domain Reflectometer (TDR) are disclosed. The TDR mode is set to time mode. A waveform for the cable is acquired from the TDR. The waveform indicates the time of a round trip distance of a signal through the cable. The length of the cable is entered via a programmed operator entry. A Velocity of Propagation (VOP) is calculated based on the length of the cable and the time of the round trip distance. The dielectric constant is then calculated based on the calculated VOP.

17 Claims, 6 Drawing Sheets

AUTOMATIC WIRE DIELECTRIC ANALYZER

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates generally to measurement devices and more particularly to an automatic wire (cable) dielectric analyzer that determines the dielectric constant for a wire having a known length. The determined dielectric constant can be used by a Time Domain Reflectometer (TDR). As used herein, the terms wire and cable are interchangeable.

When two metallic conductors are placed close together they form a transmission line that has characteristic impedance. A Time Domain Reflectometer (TDR) looks for a change in impedance that can be caused by a variety of circumstances, for example, cable damage, water ingress, change in cable type, improper installation or manufacturing flaws.

A TDR works on the same principle as radar ranging. A pulse of energy is transmitted down a cable under test. When the pulse reaches the end of the cable or a fault along the cable, part or all of the pulse energy is reflected back to the TDR. The TDR measures the time that it takes for the signal to travel down the cable and reflect back. This time is then converted to distance. The distance can then be displayed either as a textual distance reading or as a waveform.

The TDR is a very accurate instrument, however, variables in the cable itself can cause errors in the distance measurements. This error can be minimized by using a correct Velocity of Propagation (VOP) of the cable under test. The VOP is the speed at which a signal travels through the cable. The speed of light in a vacuum is 186,400 miles per second. If the speed of light is represented by the number 1 or 100%, the VOP is expressed as a percentage of the speed of light. For example, if a signal travels through a cable at 65% of the speed of light, that cable has a VOP of 0.65. Different types of cables have different VOPs.

It is important to have the correct VOP when using a TDR for fault finding. Typically, the VOP is listed in the cable manufacturer's catalog or specification sheet. However, this information is not always readily available when testing a cable. Furthermore, variations in the VOP of the same type of cable are not uncommon. For example, the VOP of a cable may change with temperature, age and humidity. The VOP may also be different for different manufacturing runs.

In order to operate a TDR and determine a distance to a fault, the dielectric constant of a wire under test must conventionally be known. As described above, it is also important to have the VOP. Like the VOP, the dielectric constant of the wire under test is usually acquired from the wire manufacturer. However, like the VOP, the dielectric constant or assurances of its reliability are often unavailable when a cable is being tested and a trial and error manual procedure is typically used to determine the dielectric constant when using a TDR. This manual trial and error process involves initially entering into the TDR a "best guess" for the dielectric constant for the cable under test. A cable under test of known length is then connected to the TDR. Markers are manually placed at the open circuit point of the TDR test cable and the open circuit point of the cable under test. The distance of the cable under test is then manually read from between these markers from the acquired waveform. Typically, there is an error in this distance compared to the known length of the cable under test. The operator then repeatedly adjusts the dielectric constant and takes subsequent TDR acquisitions and readings until the TDR distance reading of the waveform of the cable under test equals the actual known distance of the cable under test. At this point the dielectric constant is known. This is an iterative, time-consuming manual procedure that also requires analysis of TDR waveforms. A typical manual trial and error operation as described above could take about fifteen to twenty minutes to acquire an accurate reading of a dielectric constant for a cable under test.

Due to the problems described above, there is a need to automatically and accurately determine the VOP and/or dielectric constant for a cable having a known length.

BRIEF SUMMARY OF THE INVENTION

A system and method for automatically determining a dielectric constant for a known length conductor (e.g., cable or wire) for use in a Time Domain Reflectometer (TDR) are disclosed. The method extracts a travel time signal from the time domain reflectometer based on a measured travel time of a test signal along the known length conductor. A dielectric constant is computed based on the measured travel time and the known length of the conductor.

The measured travel time of the test signal is determined based on a waveform acquired by the time domain reflectometer. Before acquiring the waveform from the time domain reflectometer, the time domain reflectometer may be set to a time mode. Prior to setting the TDR mode to time mode, the current mode (e.g., distance mode) may be saved as a previous mode. After determining the dielectric constant, the TDR can then be reset to the previous mode.

The length of the conductor may be provided via operator input. The operator may enter the conductor length into the time domain reflectometer.

A Velocity of Propagation (VOP) can be computed based on the measured travel time and the known length of the conductor. The dielectric constant can then be computed based on the VOP.

The calculated dielectric constant can be displayed and/or set to the computed dielectric constant.

The calculated dielectric constant can be used in subsequent TDR functions (e.g., fault finding). The determination of whether the calculated dielectric constant is used for future TDR functions may be based on an operator's response to a displayed prompt querying whether the calculated dielectric constant should be used for subsequent TDR functions.

The VOP is calculated as conductor length/((Velocity of speed of light×time of time of round trip distance)/2).

The dielectric constant is calculated as 1.0/(Velocity of Propagation)$^2$.

BRIEF DESCRIPTION OF THE DRAWINGS

These as well as other features of the present invention will become more apparent upon reference to the drawings wherein:

FIG. 1 (FIGS. 1A–1C) is a flow diagram illustrating exemplary logic for determining the VOP and dielectric constant for a cable of known length;

DETAILED DESCRIPTION OF THE INVENTION

The present invention includes logic for automatically determining the Velocity of Propagation (VOP) and dielectric constant for a conductor (i.e., wire or cable) having a known length. In exemplary embodiments, this logic is used in conjunction with a Time Domain Reflectometer (TDR). This automatic process eliminates the need for the iterative trial and error process that is typically performed when the dielectric constant for a cable of known length is not known. This automatic process overcomes the deficiencies (i.e., time-consuming and error prone) of the iterative manual trial and error procedure that is typically used.

Figure 1A:
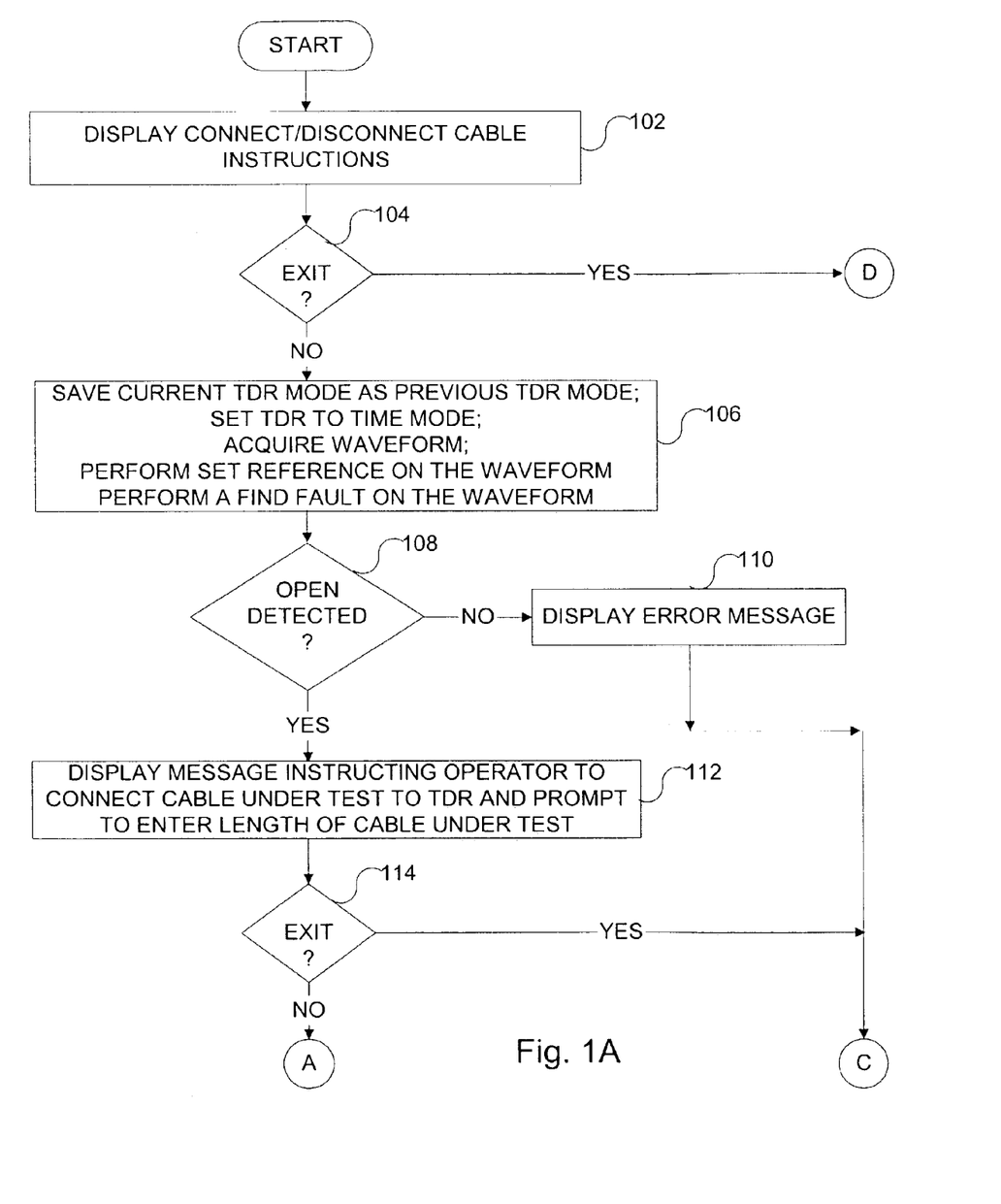
Figure 1B:
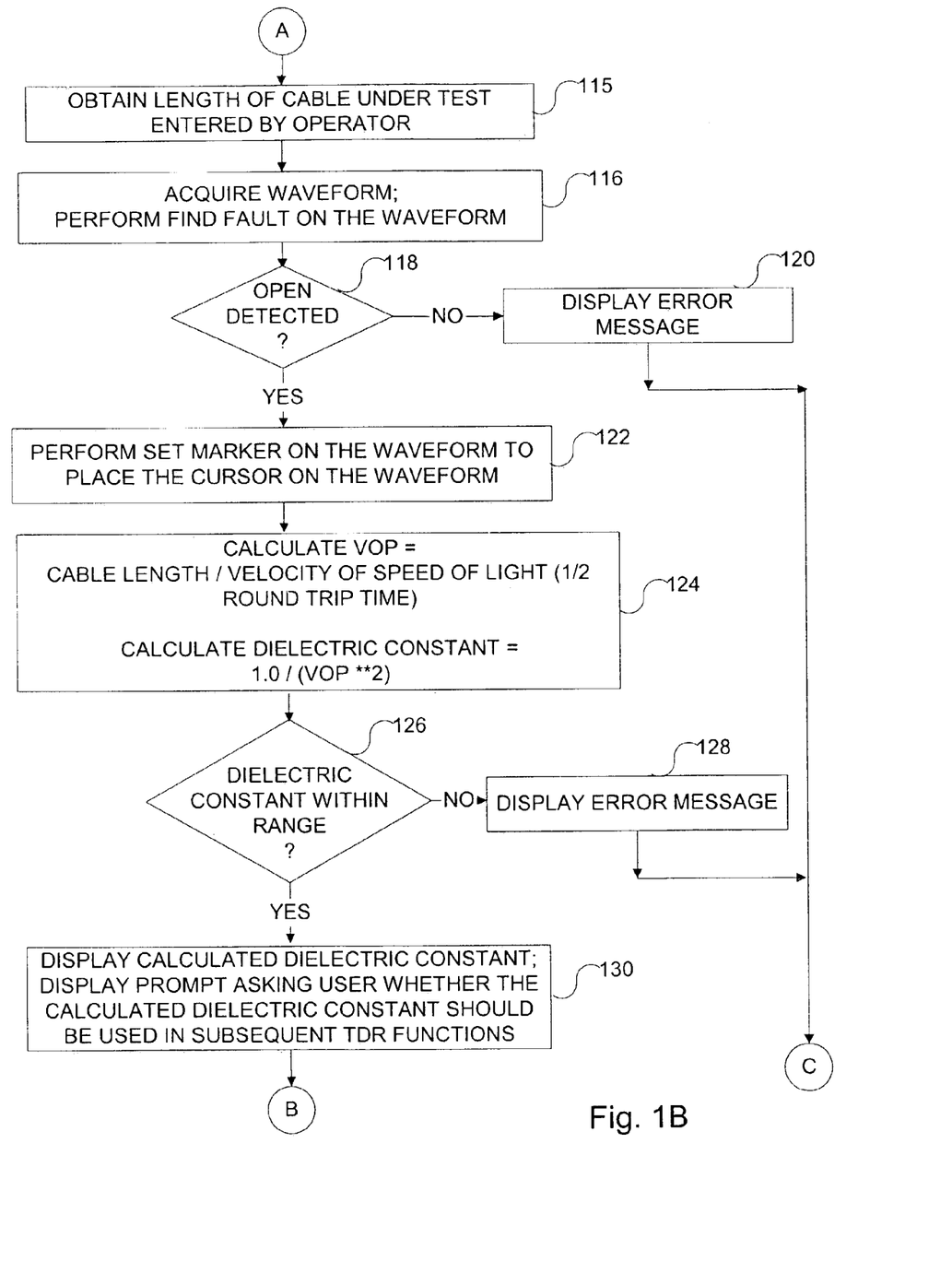
Figure 1C:
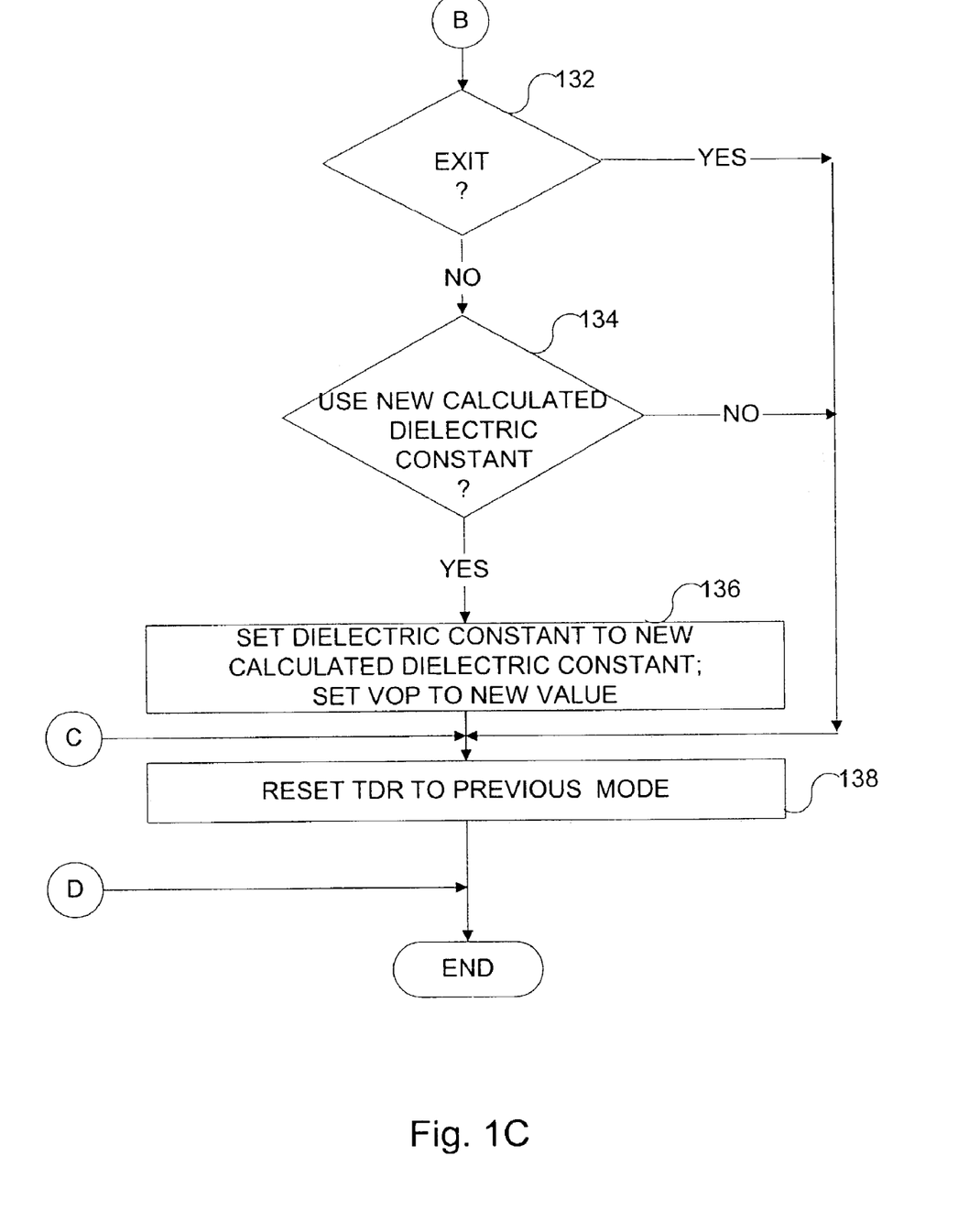
Figure 2A:
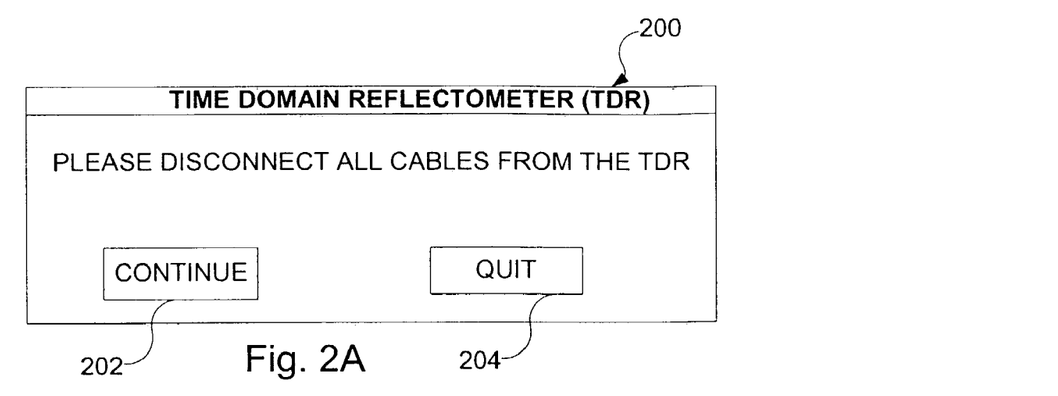
FIGS. 2A–2C illustrate exemplary screen displays for use in conjunction with the logic shown in FIG. 1.
Figure 2B:
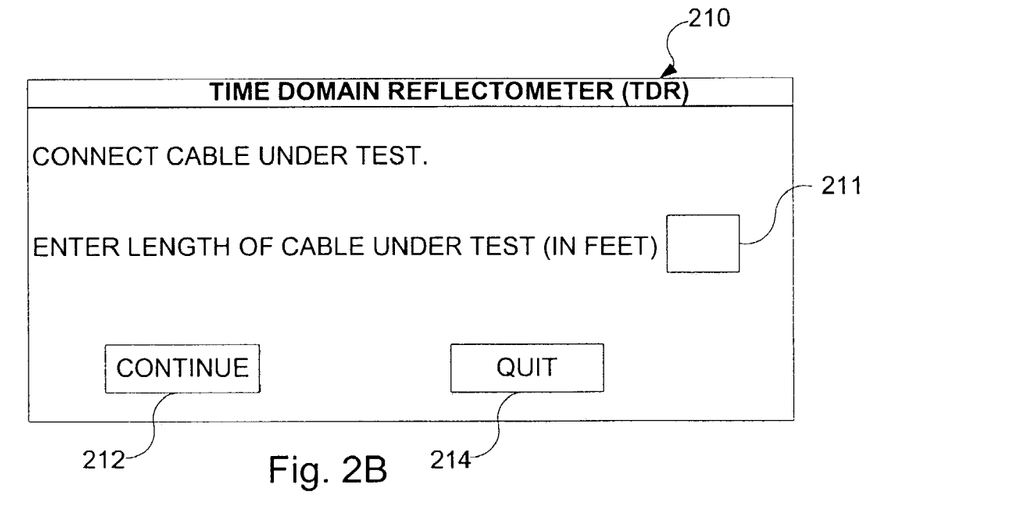
Figure 2C:
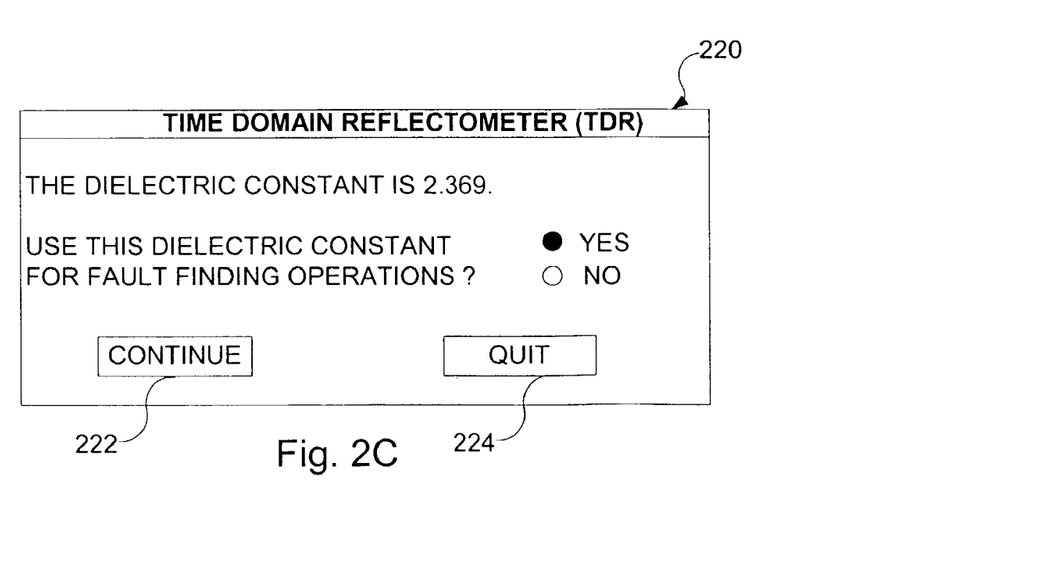

Referring now to the drawings wherein the showings are for purposes of illustrating preferred embodiments of the present invention only, and not for purposes of limiting the same, FIG. 1 (shown as FIGS. 1A–1C) is a flow diagram illustrating exemplary logic for determining the dielectric constant for a wire of known length and FIGS. 2A–2C are exemplary screen displays that can be used in conjunction with the logic shown in FIGS. 1A–1C.

The automatic wire dielectric analyzer program analyzes a known length of wire and determines its dielectric constant. Prior to analyzing the known length of wire, the TDR must be properly configured and operational. The logic of FIG. 1 (FIG. 1A) moves from a start block to block 102 where cable connection and/or disconnection instructions are displayed for the operator. FIG. 2A illustrates an exemplary display 200 that provides the operator with cable disconnection instructions. Disconnecting all of the cables allows the operator to perform a reference check prior to connecting the cable under test. Alternatively, a known cable could be connected in order to perform the reference check. Instead of connecting or disconnecting the cable(s) as instructed, the operator may exit the dielectric analyzer program, e.g., by pressing a quit button 204. Alternatively, the operator may connect or disconnect the cables as instructed and continue, e.g., by pressing a continue button 202. If the user opts to exit (yes in decision block 104), the logic of FIG. 1 ends.

If the user has not opted to exit, but rather wants to continue (no in decision block 104), the logic proceeds to block 106 where the current TDR mode is saved as a Previous TDR Mode and the TDR is set to operate in time mode. Typically, the TDR mode at this time is distance mode, in which case the Previous TDR Mode is set to distance mode. When the TDR is set to operate in the time mode, the X-axis is set to time in nanoseconds instead of distance. A waveform for the cable is acquired. A set reference is performed on the waveform. A find fault is then performed on the waveform.

The logic then moves to decision block 108 where a test is performed to determine whether an open was automatically detected by the TDR. If not, there is a problem with the TDR and the logic moves to block 110 where an error message is displayed. The logic then moves to block 138 (FIG. 1C) where the TDR is reset to the Previous TDR Mode. The logic of FIG. 1 then ends.

If, however, an open was detected (yes in decision block 108), the logic proceeds to block 112 where a user interface display instructs the operator to hook-up a test cable to the TDR. When the program is started, it automatically locates the end of the test cable and sets a marker to this point on the TDR graphical waveform which becomes the reference starting point from which to measure a cable under test. A user interface display 210, such as the one shown in FIG. 2B, is then displayed instructing the operator to hook-up the cable under test and enter its length (e.g., in feet or meters). In exemplary embodiments, such as the one shown in FIG. 2B, the operator can elect to quit by pressing a quit button 214 or can enter the cable length and opt to continue (start the dielectric analyzer program) by pressing a continue button 212. If the operator opts to quit (yes in decision block 114), the logic moves to block 138 (FIG. 1C) where the TDR is reset to the Previous TDR Mode. The logic of FIG. 1 ends.

If, however, the operator enters the length of the cable under test and opts to continue (no in decision block 114), the logic moves to block 115 (FIG. 1B) where the length of the cable under test entered by the operator is obtained. The logic then moves to block 116 where the program starts the TDR waveform acquisition in the time mode. The logic performs a find fault on the waveform. The logic then proceeds to decision block 118 to determine if an open circuit was detected at the end of the cable under test. If an open circuit was not detected (no in decision block 118), the logic moves to block 120 where an error message is displayed and the logic the then moves to block 138 (FIG. 1C) where the TDR is reset to the Previous TDR Mode. The logic of FIG. 1 ends.

If an open was detected (yes in decision block 118), the logic proceeds to block 122 where another marker is set to this point (the end of the cable where the open was detected). The time between the set reference starting point and the end of the cable under test is the round-trip time it took for the TDR step signal to traverse the cable under test.

The logic then proceeds to block 124 where the VOP and dielectric constant for the cable under test are calculated as described next.

Transmission for electrical signals in free space is expressed by the following equation:

$$\text{Distance} = \text{Velocity} * \text{Time} \quad (1)$$

(with Velocity being the speed of light in free space)

In the case of a cable, the velocity of electrical signals traveling in the cable will be less than the speed of light. Its actual speed will be factored by its Velocity of Propagation Factor (VOP) which is a function of the physical attributes and dielectric of the cable. Therefore, in a cable:

$$\text{Distance} = \text{Velocity of Speed of Light} * \text{VOP} * \text{Time} \quad (2)$$

This may also be expressed as:

$$\text{VOP} = \frac{\text{length of cable under test}}{\text{Velocity of Speed of Light} (1/2 \text{ round trip time})} \quad (3)$$

The time displayed by the TDR graphical display from the start and end points of the cable under test is round trip time, so this time must be divided by two to determine the time traveled one way over the length of the cable under test. The length of the cable under test was entered by the operator (blocks 112 and 115).

Since the length of the cable under test is known, and the time between the start reference marker and open circuit marker at the end of the cable under test is automatically calculated from the stored TDR X-axis data, the VOP can be calculated by the program using the equation above.

Once the VOP of the cable under test has been determined, the dielectric constant of the cable can be calculated because it is related to the VOP as shown in the following equation:

$$\text{Dielectric Constant }(\xi) = \frac{1}{(\text{VOP})^2} \qquad (4)$$

It will be appreciated that since the dielectric constant is related to the VOP as shown above, the dielectric constant can be computed without performing the intermediary step of computing the VOP as illustrated in the equation below:

$$\text{Dielectric Constant }(\xi) = \frac{1}{\left(\frac{\text{length of cable under test}}{\frac{\text{Velocity of Speed of Light}}{(1/2 \text{ round trip time})}}\right)^2} \qquad (5)$$

After the program determines the dielectraic constant, the logic moves to decision block 126 to determine if the calculated dielectric constant is within an allowable range. If not, the logic moves to block 128 where an error message is displayed. The logic then moves to block 138 (FIG. 1C) where the TDR is reset to the Previous TDR Mode. The logic of FIG. 1 then ends. If the dielectric constant is within the allowable range, the logic moves to block 130 where the dielectric constant is displayed to the operator. In exemplary embodiments, the operator is also asked whether this dielectric constant should be automatically inserted into the TDR operating program for finding cable faults. FIG. 2C illustrates an exemplary display 220 that shows the calculated dielectric constant and a prompt asking the operator whether the calculated dielectric constant should automatically be inserted into the TDR operating program for finding cable faults. The exemplary display allows the operator to quit, e.g., by pressing quit button 224 or to continue by pressing continue button 222.

If the user opts to quit (yes in decision block 132 of FIG. 1C), the logic moves to block 138 where the TDR is set to the Previous TDR mode. The logic of FIG. 1 then ends.

If the user does not opt to quit, but rather opts to continue (no in decision block 132), the logic proceeds to decision block 134 where a test is made to determine if the new dielectric constant should be used in TDR find fault operations. In exemplary embodiments, the response to this question was obtained from the operator (e.g., see block 130 and display 220 shown in FIG. 2C). If the dielectric constant should be used in fault finding operations (yes in decision block 134), the logic moves to block 136 where the dielectric constant for the TDR functions is set to the newly calculated dielectric constant and the VOP is set to the newly calculated VOP value. Regardless of whether the newly calculated dielectric constant is to be used for future fault finding operations, the logic proceeds to block 138 where the TDR mode is reset to the previous TDR mode. As mentioned earlier, this mode is typically distance mode, in which case the TDR X-axis is switched to the distance mode and the program is ready for TDR operation. The logic of FIG. 1 then ends.

Figure 3:
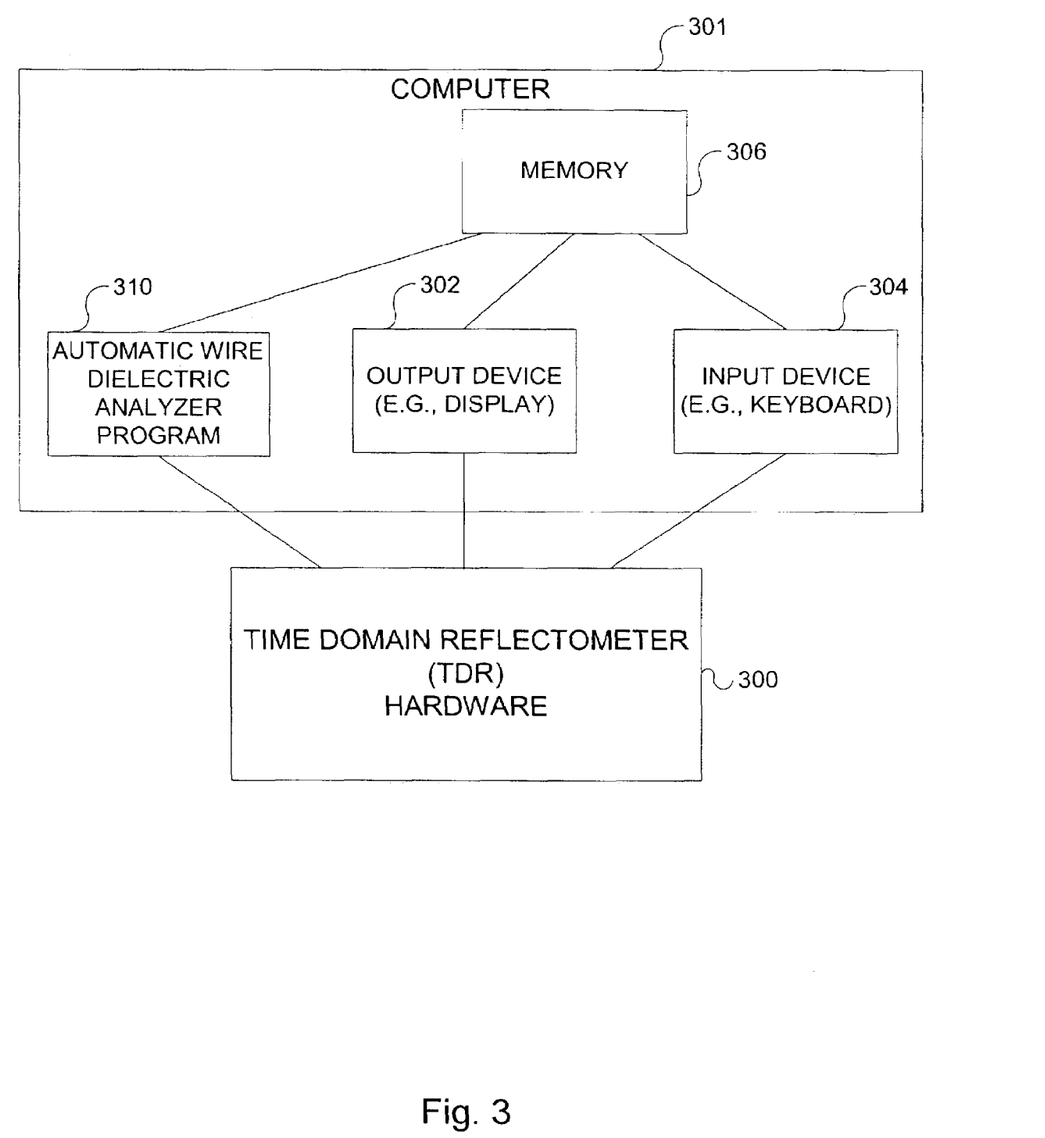
FIG. 3 is a block diagram illustrating the automatic wire dielectric analyzer and the major components of a PC based time domain reflectometer (TDR) that is used in conjunction with the automatic wire dielectric analyzer.

FIG. 3 is a block diagram illustrating major components of a TDR 300 and a computer 301. As described above, the automatic wire dielectric analyzer 310 is preferably used in combination with a TDR 300. The automatic dielectric analyzer 310 may be software that is separate from the TDR 300 but communicates with the TDR 300 software. The automatic wire dielectric analyzer logic 310 could also be a software plug-in or logic in the TDR 300 could be modified to include the logic of the automatic wire dielectric analyzer 310.

The computer 301 includes an output device 302 such as a display device. The display device 302 displays user interface screens such as those shown in FIGS. 2A–2C and described above. The computer 301 also includes a user input device 304, such as a keyboard. The user can enter information via the input device 304. For example, the user can enter the length of the cable under test. The computer 301 also includes memory 306. The memory includes logic for communicating with the output device 302, the input device 304 and the automatic wire dielectric analyzer 310. As described above, in exemplary embodiments the automatic wire dielectric analyzer program 310 is implemented in the computer memory 306.

Figure 4:
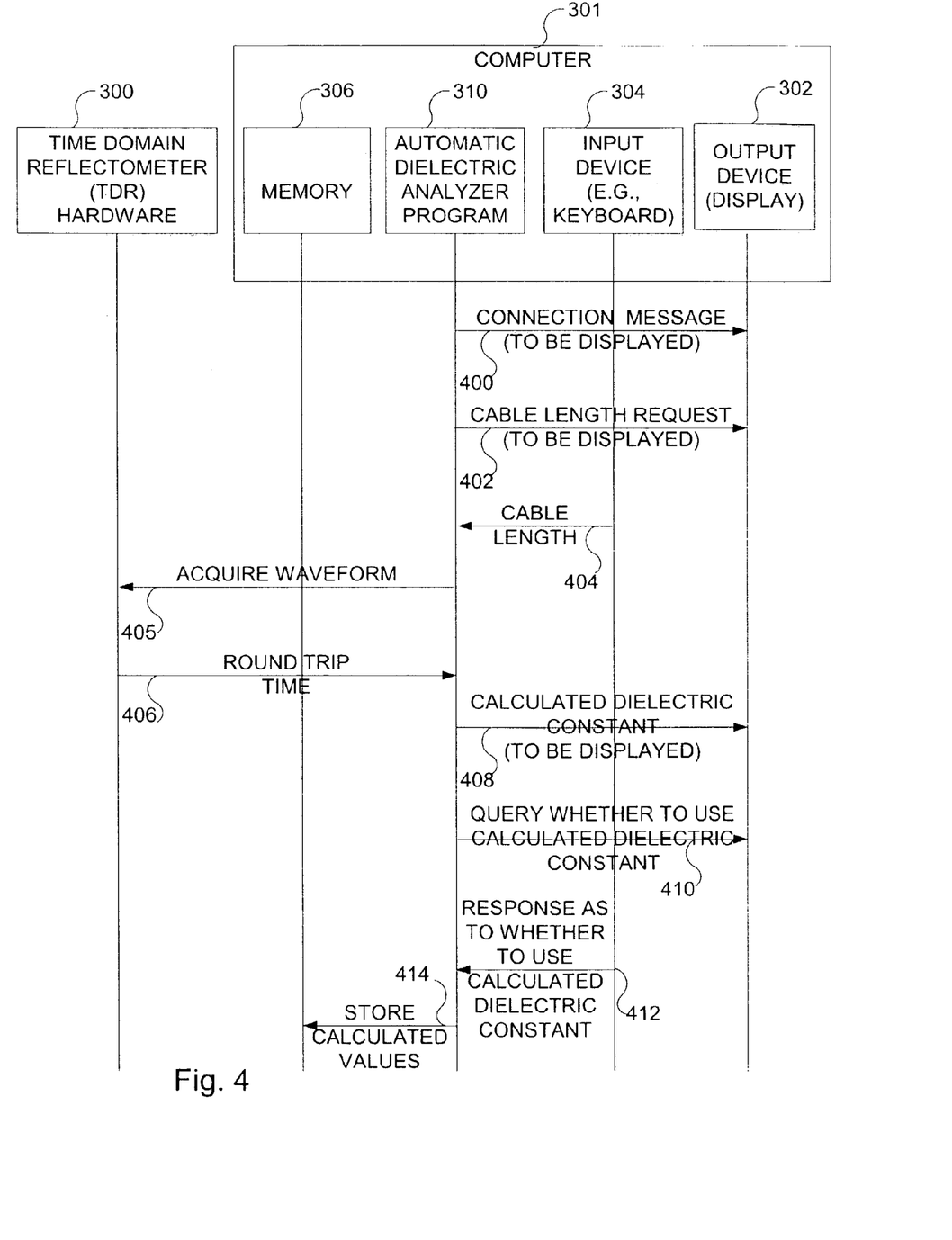
FIG. 4 is a message sequence diagram showing communications between the automatic wire dielectric analyzer and the time domain reflectometer.

FIG. 4 is a message sequence diagram illustrating communications between the automatic wire dielectric analyzer program 310, the TDR 300 and various components of the 301 (e.g., output device 302, input device 304 and memory 306). It will be appreciated that the automatic wire dielectric analyzer 310 may not communicate with the output device 302 and the input device 304 directly, but rather via logic in the computer memory 306 as shown in FIG. 3. However, for ease of understanding, the message sequence diagram shows the intended message source or destination (e.g., output device 302 or input device 304) of the computer 301 regardless of whether the automatic wire dielectric analyzer logic 310 communicates directly with the device or indirectly with the device via logic in the computer memory 306.

The automatic wire dielectric analyzer 310 sends a connection message 400 to be displayed to the operator via the computer display 302. An exemplary connection message display 200 is shown in FIG. 2A.

The automatic wire dielectric analyzer 310 then sends a request for cable length message 402 to be displayed to the operator via the computer display 302. FIG. 2B illustrates an exemplary display 210 requesting the length of the cable under test. After the operator enters the requested cable length and indicates a desire to continue, the entered cable length 404 is sent to the automatic wire dielectric analyzer 310.

The automatic wire dielectric analyzer 310 then issues a request to the TDR 300 for a waveform 405.

The TDR 300 acquires a waveform for the cable under test. A round trip time can be determined from the acquired waveform. The round trip time 406 for the signal 405 is provided to the automatic wire dielectric analyzer 310 by the TDR 300.

The automatic wire dielectric analyzer 310 can then calculate the VOP based on the length of the cable under test and the round trip signal time as described above. The automatic wire dielectric analyzer 310 can then calculate the dielectric constant from the VOP as described above.

The automatic wire dielectric analyzer 310 provides the calculated dielectric constant 408 for display on the computer display device 302. The automatic wire dielectric analyzer 310 also sends a message 410 to the computer display 302 to query the operator as to whether the calculated dielectric constant should be used for future TDR functions. FIG. 2C illustrates an exemplary display 220 displaying the calculated dielectric constant and querying whether the calculated dielectric constant should be used for future TDR functions. The user's response 412 is provided to the automatic wire dielectric analyzer 310 by the computer input device 304. If the user wishes to use the calculated dielectric constant for future functions, a message 414 is sent from the automatic wire dielectric analyzer 310 to the computer 301 to store the calculated VOP and dielectric constant for future use in TDR functions.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A method for automatically determining a dielectric constant for a known length cable for use with a time domain reflectometer, the method comprising the steps of:
    (a) extracting from the time domain reflectometer a travel time signal based on a measured travel time of the test signal along the known length cable;
    (b) calculating a Velocity of Propagation as length of cable/((Velocity of Speed of Light in a vacuum*time of round trip distance)/2); and
    (c) computing the dielectric constant based on the Velocity of Propagation.

2. A method for automatically determining a dielectric constant for a known length cable for use with a time domain reflectometer, the method comprising the step of:
    (a) extracting from the time domain reflectometer a travel time signal based on a measured travel time of the test signal along the known length cable; and
    (b) calculating the dielectric constant as 1.0/(length of cable/((Velocity of Speed of Light in a vacuum*time of round trip distance)/2))$^2$.

3. A method for automatically determining a dielectric constant for a cable of known length for use in a time domain reflectometer, the method comprising the steps of:
    (a) obtaining a time domain reflectometer current mode;
    (b) storing the time domain reflectometer current mode as a time domain reflectometer previous mode;
    (c) setting the current mode to the time mode in the time domain reflectometer;
    (d) acquiring a waveform for the cable from the time domain reflectometer, the waveform indicating a time of a round trip distance of a signal through the cable;
    (e) obtaining a length of the cable;
    (f) calculating a Velocity of Propagation based on the length of the cable and the time of the round trip distance;
    (g) calculating the dielectric constant based on the calculated Velocity of Propagation; and
    (h) setting the time domain reflectometer current mode to the time domain reflectometer previous mode.

4. A method for automatically determining a dielectric constant for a cable of known length for use in a time domain reflectometer, the method comprising the steps of:
    (a) acquiring a waveform for the cable from the time domain reflectometer, the waveform indicating a time of a round trip distance of a signal through the cable;
    (b) obtaining a length of the cable;
    (c) calculating a Velocity of Propagation based on the length of the cable and the time of the round trip distance;
    (d) calculating the dielectric constant based on the calculated Velocity of Propagation;
    (e) determining whether the dielectric constant should be used for subsequent functions of the time domain reflectometer; and
    (f) updating a dielectric constant value to be used for subsequent functions of the time domain reflectometer if it is determined that the dielectric constant should be used for subsequent functions thereof.

5. The method of claim 4, wherein determining whether the dielectric constant should be used for subsequent functions of the time domain reflectometer in step (e) comprises:
    (1) displaying a message to an operator inquiring whether the calculated dielectric constant should be used for subsequent functions of the time domain reflectometer; and
    (2) obtaining a response from the operator as to whether the calculated dielectric constant should be used for subsequent functions of the time domain reflectometer.

6. A method for automatically determining a dielectric constant for a cable of known length for use in a time domain reflectometer, the method comprising the steps of:
    (a) acquiring a waveform for the cable from the time domain reflectometer, the waveform indicating a time of a round trip distance of a signal through the cable;
    (b) obtaining a length of the cable;
    (c) calculating a Velocity of Propagation as length of cable/((Velocity of Speed of Light in a vacuum*time of round trip distance)/2); and
    (d) calculating the dielectric constant based on the calculated Velocity of Propagation.

7. A method for automatically determining a dielectric constant for a cable of known length for use in a time domain reflectometer, the method comprising the steps of:
    (a) obtaining a time domain reflectometer current mode;
    (b) storing the time domain reflectometer current mode as a time domain reflectometer previous mode;
    (c) setting a current mode to a time mode in the time domain reflectometer;
    (d) acquiring a waveform for the cable from the time domain reflectometer, the waveform indicating the time of a round trip distance of a signal through the cable;
    (e) obtaining the known length of the cable via operator entry;
    (f) calculating a Velocity of Propagation based on the length of the cable and the time of the round trip distance;
    (g) calculating the dielectric constant based on the calculated Velocity of Propagation;
    (h) displaying the calculated dielectric constant; and
    (i) setting the time domain reflectometer current mode to the time domain reflectometer previous mode.

8. The method of claim 7, further comprising:
    (j) determining whether the dielectric constant should be used for subsequent functions of the time domain reflectometer; and
    (k) updating a dielectric constant value to be used for subsequent functions of the time domain reflectometer if it is determined that the dielectric constant should be used for subsequent functions thereof.

9. The method of claim 8, wherein determining whether the dielectric constant should be used for subsequent functions of the time domain reflectometer in step (j) comprises:
   (1) displaying a message to an operator inquiring whether the calculated dielectric constant should be used for subsequent functions of the time domain reflectometer; and
   (2) obtaining a response from the operator to the message inquiring whether the calculated dielectric constant should be used for subsequent functions of the time domain reflectometer.

10. The method of claim 7, wherein the Velocity of Propagation is calculated as length of cable/((Velocity of Speed of Light in a vacuum*time of round trip distance)/2).

11. The method of claim 7, wherein the dielectric constant is calculated as $1.0/(\text{Velocity of Propagation})^2$.

12. An automatic wire dielectric analyzer for use with a time domain reflectometer configured to generate a waveform indicating a round trip signal time for a cable under test, the automatic wire dielectric analyzer comprising:
   (a) an output device configured to display information to a user, the information comprising a request for entry of a length of the cable under test;
   (b) a user input device configured to accept input from the user including the length of the cable under test;
   (c) a waveform input device configured to accept waveform information indicating the round trip signal time for the cable under test from the time domain reflectometer;
   (d) a Velocity of Propagation calculator configured to determine a Velocity of Propagation value based on the length of the cable under test and the round trip signal time for the cable under test; and
   (e) a dielectric constant calculator configured to calculate the dielectric constant for the cable under test based on the calculated Velocity of Propagation.

13. The automatic wire dielectric analyzer of claim 12, wherein the Velocity of Propagation calculator is calculated as Velocity of Propagation=length of cable/((Velocity of Speed of Light in a vacuum*time of round trip distance)/2).

14. The automatic wire dielectric analyzer of claim 12, wherein the dielectric constant calculator calculates the dielectric constant as dielectric constant $1.0/(\text{Velocity of Propagation})^2$.

15. An automatic wire dielectric analyzer for use with a time domain reflectometer configured to generate a waveform indicating a round trip signal time for a cable under test, the time domain reflectometer having a display device for requesting a length of the cable under test from the operator and an input device for accepting input comprising the length of the cable under test from an operator, the automatic wire dielectric analyzer comprising:
   (a) a communications interface for transmitting information to and receiving information from the time domain reflectometer, the received information comprising the length of the cable under test and waveform information indicating the round trip signal time for the cable under test;
   (b) a Velocity of Propagation calculator configured to determine a Velocity of Propagation value based on the length of the cable under test and the round trip signal time for the cable under test; and
   (c) a dielectric constant calculator configured to calculate the dielectric constant for the cable under test based on the calculated Velocity of Propagation.

16. The automatic wire dielectric analyzer of claim 14, wherein the Velocity of Propagation calculator determines the Velocity of Propagation as Velocity of Propagation=length of cable/((Velocity of Speed of Light in a vacuum*time of round trip distance)/2).

17. The automatic wire dielectric analyzer of claim 14, wherein the dielectric constant calculator calculates the dielectric constant as dielectric constant $1.0/(\text{Velocity of Propagation})^2$.

* * * * *